(12) United States Patent
Koh

(10) Patent No.: US 8,604,556 B2
(45) Date of Patent: Dec. 10, 2013

(54) GATE PATTERN OF SEMICONDUCTOR DEVICE AND METHOD FOR FABRICATING THE SAME

(75) Inventor: Joon-Young Koh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 161 days.

(21) Appl. No.: 12/818,662

(22) Filed: Jun. 18, 2010

(65) Prior Publication Data

US 2011/0073965 A1 Mar. 31, 2011

(30) Foreign Application Priority Data

Sep. 28, 2009 (KR) .................. 10-2009-0092034

(51) Int. Cl.
*H01L 29/78* (2006.01)
*H01L 29/737* (2006.01)
*H01L 29/792* (2006.01)

(52) U.S. Cl.
USPC ....... 257/395; 257/412; 257/E21.19; 438/591

(58) Field of Classification Search
USPC ............ 257/412, E21.19, 327, 384, 330, 333, 257/E21.177; 438/584, 585, 589, 591, 438/E21.177, E21.19, 592
See application file for complete search history.

(56) References Cited

U.S. PATENT DOCUMENTS

| | | | | |
|---|---|---|---|---|
| 5,677,234 A * | 10/1997 | Koo et al. | ...................... | 438/439 |
| 6,159,781 A * | 12/2000 | Pan et al. | ...................... | 438/167 |
| 6,271,563 B1 * | 8/2001 | Yu et al. | ........................ | 257/344 |
| 6,465,842 B2 * | 10/2002 | Nishinohara | .................. | 257/330 |
| 6,656,824 B1 * | 12/2003 | Hanafi et al. | ................... | 438/585 |
| 7,419,892 B2 * | 9/2008 | Sheppard et al. | ............. | 438/522 |
| 7,652,317 B2 * | 1/2010 | Watanabe | ...................... | 257/315 |
| 7,652,385 B2 * | 1/2010 | Kuramoto | ...................... | 257/790 |
| 7,692,238 B2 * | 4/2010 | Nihei | ............................. | 257/330 |
| 2007/0170499 A1 * | 7/2007 | Araki | ............................. | 257/330 |
| 2009/0181530 A1 * | 7/2009 | Lisiansky et al. | ............. | 438/591 |
| 2010/0084719 A1 * | 4/2010 | Masuoka et al. | .............. | 257/411 |
| 2010/0102385 A1 * | 4/2010 | Lee et al. | ...................... | 257/331 |

FOREIGN PATENT DOCUMENTS

KR 1020050109816 11/2005

OTHER PUBLICATIONS

Notice of Allowance issued from Korean Intellectual Property Office on Oct. 20, 2011.

* cited by examiner

*Primary Examiner* — Daniel Luke
*Assistant Examiner* — Edward Chin
(74) *Attorney, Agent, or Firm* — IP & T Group LLP

(57) ABSTRACT

A method for fabricating a semiconductor device includes forming a recess pattern by selectively etching a substrate; forming a gate dielectric layer filling the recess pattern on the substrate; forming a groove by selectively etching the gate dielectric layer; forming a polysilicon electrode filling the groove; forming an electrode metal layer on the polysilicon electrode and the gate dielectric layer; and forming a gate pattern by etching the electrode metal layer and the gate dielectric layer. The recess pattern is formed along an edge portion of the gate pattern as a quadrilateral periphery.

16 Claims, 6 Drawing Sheets

GATE PATTERN OF SEMICONDUCTOR DEVICE AND METHOD FOR FABRICATING THE SAME

CROSS-REFERENCES TO RELATED APPLICATIONS

The present application claims priority of Korean Patent Application No. 10-2009-0092034, filed on Sep. 28, 2009, which is incorporated herein by reference in its entirety.

BACKGROUND OF THE INVENTION

Exemplary embodiments of the present invention relate to semiconductor fabrication technology, and more particularly, to a gate pattern of a semiconductor device and a method for fabricating the same.

Examples of conventional processes for forming a gate pattern of a semiconductor device are as follows.

FIGS. 1A and 1B are cross-sectional views illustrating processes of a conventional method for fabricating a gate pattern of a semiconductor device.

As shown in FIG. 1A, a gate dielectric layer 11 is formed on a substrate 10.

A polysilicon layer 12 is formed on the gate dielectric layer 11.

Ion implantation is performed on the polysilicon layer 12. N+ ions or P+ ions may be implanted depending upon whether the substrate 10 is an N-type or a P-type semiconductor.

As shown in FIG. 1B, a metal layer for an electrode is formed on the polysilicon layer 12. After forming a hard mask layer on the metal layer for an electrode, patterning is performed to form a gate pattern G in which a polysilicon electrode 12A, a metal electrode 13, and a gate hard mask 14 are stacked.

However, the above-described conventional method for fabricating a gate pattern raises concerns regarding dopant penetration and segregation phenomena, which result from insufficient doping of the polysilicon electrode 12A or continuous decrease in the thickness of the gate dielectric layer 11 according to the size decrease of semiconductor devices. Also, concerns are raised in that the on-current of the device is likely to be degraded due to poly depletion and the transconductance of the device is likely to be degraded due to increase in the effective thickness (Tox) of an oxide layer.

In addition, as the size of a semiconductor device decreases, the poly depletion effect resulting from overlapping gate edge fringing fields in short channels increases and contributes to degradation of device characteristics. Therefore, it is desired to alleviate such a gate edge fringing field crowding phenomenon.

SUMMARY OF THE INVENTION

Exemplary embodiments of the present invention are directed to a gate pattern of a semiconductor device and a method for fabricating the same, which can address concerns regarding insufficient doping concentration of a polysilicon electrode and dopant penetration.

In accordance with an embodiment of the present invention, a method for fabricating a semiconductor device includes: forming a recess pattern by selectively etching a substrate; forming a gate dielectric layer filling the recess pattern on the substrate; forming a groove by selectively etching the gate dielectric layer; forming a polysilicon electrode filling the groove; forming an electrode metal layer on the polysilicon electrode and the gate dielectric layer; and forming a gate pattern by etching the electrode metal layer and the gate dielectric layer, wherein the recess pattern is formed along an edge portion of the gate pattern as a quadrilateral periphery.

The gate dielectric layer may have a protruding area over a top surface of the substrate along the edge portion of the gate pattern as a quadrilateral periphery.

The gate dielectric layer may include an oxide layer and an oxynitride layer stacked on each other. The oxynitride layer may be formed by nitrating the oxide layer to a certain thickness.

The electrode metal layer may be formed of tungsten.

In accordance with another embodiment of the present invention, a gate pattern of a semiconductor device includes: a substrate having a recess pattern; a gate dielectric layer formed on the substrate, filling the recess pattern and protruding over the substrate, and having a groove; a polysilicon electrode filling the groove; and a metal electrode formed on the polysilicon electrode and the gate dielectric layer.

The recess pattern may be formed along an edge portion of the gate pattern as a quadrilateral periphery. The gate dielectric layer may have a protruding area formed along an edge portion of the gate pattern as a quadrilateral periphery. The gate dielectric layer may include an oxide layer and an oxynitride layer stacked on each other.

In accordance with an embodiment of the present invention, a semiconductor device may include: a gate pattern of a semiconductor device, comprising: a substrate having a recess pattern; a gate dielectric layer formed on the substrate, filling the recess pattern and protruding over the substrate, and having a groove; a polysilicon electrode filling the groove; and a metal electrode formed on the polysilicon electrode and the gate dielectric layer.

The recess pattern may be formed along an edge portion of the gate pattern as a quadrilateral periphery.

The gate dielectric layer may have a protruding area formed along an edge portion of the gate pattern as a quadrilateral periphery.

The gate dielectric layer may include an oxide layer and an oxynitride layer stacked on each other.

The gate pattern, further may include: a gate hard mask formed on the metal electrode; and a gate spacer formed on sidewalls of the gate hard mask, the metal electrode, and the gate dielectric layer.

The gate pattern, may include a gate spacer of a nitride layer formed on the gate pattern to cover both sidewalls of the gate pattern.

The gate dielectric layer may surround the polysilicon electrode in the width/length directions of a channel.

An edge portion of the channel may be surrounded by the gate dielectric layer.

DESCRIPTION OF SPECIFIC EMBODIMENTS

Figure 1A:
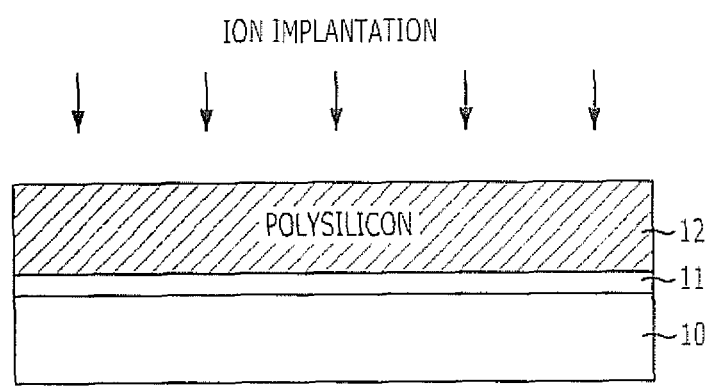
FIGS. 1A and 1B are cross-sectional views illustrating processes of a conventional method for fabricating a gate pattern of a semiconductor device.
Figure 1B:
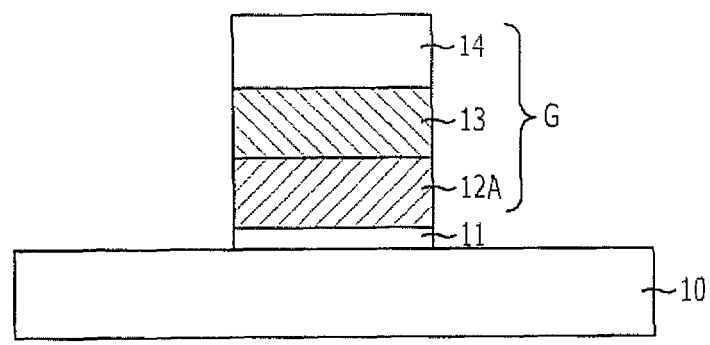

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
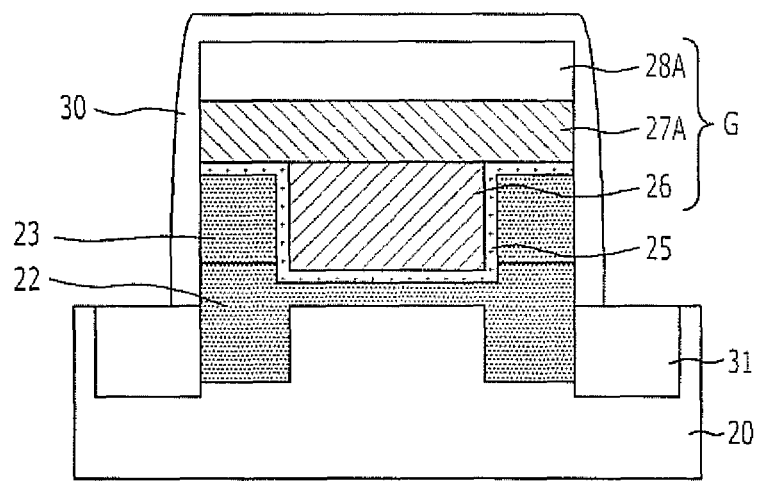
FIG. 2 is a cross-sectional view illustrating a semiconductor device in accordance with an embodiment of the present invention.

FIG. 2 is a cross-sectional view illustrating a semiconductor device in accordance with an embodiment of the present invention.

As shown in FIG. 2, a recess pattern is formed in a substrate 20, and a gate dielectric layer is formed to fill the recess pattern and protrude over the surface of the substrate 20 so that the gate dielectric layer is formed in an area where the recess pattern 21 is formed and along a gate edge portion to surround a polysilicon electrode 26. The gate dielectric layer includes a first oxide layer 22, a second oxide layer 23, and an oxynitride layer 25 that are stacked on one another.

A metal electrode 27A and a gate hard mask 28A are stacked on the gate dielectric layer and the polysilicon electrode 26 which is surrounded by the gate dielectric layer and forms a gate pattern G.

A gate spacer 30 is formed on the sidewall of the gate pattern G, and source and drain regions 31 are formed in the substrate 20 on both sides of the gate pattern G.

Such formation of the gate dielectric layer on the gate edge portion so as to surround the polysilicon electrode 26 alleviates/reduces effects of a fringing electric field crowding phenomenon, which may occur in the gate edge portion, and prevents/reduces lowering of transconductance of the device.

Furthermore, the main channel of the device is surrounded by the gate dielectric layer and the gate dielectric layer is used as an interdiffusion barrier during ion implantation for forming the source and drain regions 31. This improves characteristics with respect to the threshold voltage (Vt) variation of the device, alleviates effects of the electric fields at the channel edge, and improves performance with respect to the narrow width/short channel effect.

A detailed fabricating method will now be described with reference to FIGS. 3A to 3F.

FIGS. 3A to 3F are cross-sectional views illustrating processes of a method for fabricating a semiconductor device in accordance with an embodiment of the present invention. FIGS. 3A to 3F illustrate cross-sectional views of a transistor in FIG. 4 taken along a line A-A' of FIG. 4.

Figure 3A:
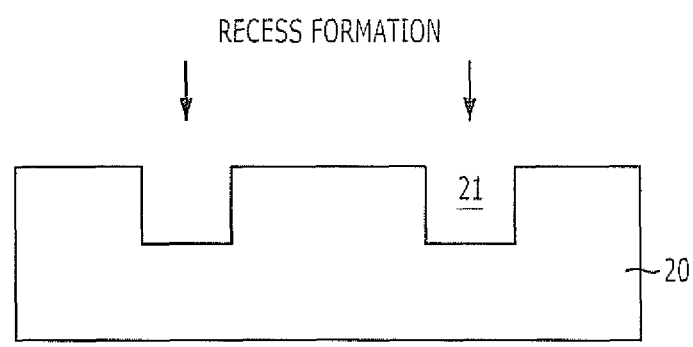
FIGS. 3A to 3F are cross-sectional views illustrating processes of a method for fabricating a semiconductor device in accordance with an embodiment of the present invention.

Referring to FIG. 3A, the substrate 20 is selectively etched to form a recess pattern 21. The recess pattern 21 is formed at a channel edge portion. The recess pattern 21 is formed in the shape of a recess channel and a saddle fin by selectively etching an active region (not shown) and an isolation layer (not shown) of the substrate 20. Specifically, the recess pattern 21 is formed in a quadrilateral shape along the gate edge portion. The shape of the recess pattern 21 will be more specifically described later with reference to FIG. 4.

The recess pattern 21, which is formed in a quadrilateral shape along the gate edge portion, acts as a recess channel and a saddle fin. The recess channel is formed by etching parts of the active area adjacent to opposite edges of the area, in which a gate pattern is to be formed later, so as to increase the channel length and improve refresh characteristics. The saddle fin is formed by etching the isolation layer so that the isolation layer becomes lower than the active area at the junction between the isolation layer and the active area, thereby increasing the channel width.

Therefore, the recess pattern 21 increases the channel length and width and improves the short channel effect and on-current.

Figure 3B:
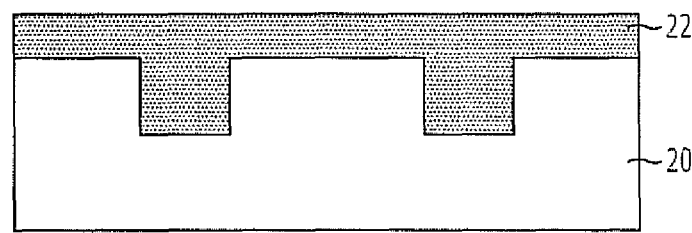

Referring to FIG. 3B, a first oxide layer 22 is formed on the substrate 20 so as to fill the recess pattern 21. The first oxide layer 22 fills the channel edge portion, in which the recess pattern 21 is formed, to prevent/reduce interdiffusion of source and drain dopant to alleviate effects of the electric fields at a channel edge, to reduce threshold voltage (Vt) variation, and to improve transistor performance with respect to the short channel effect.

Figure 3C:
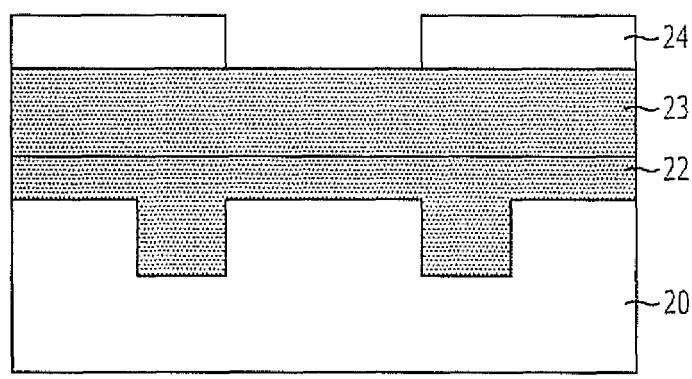

As shown in FIG. 3C, a second oxide layer 23 is formed on the first oxide layer 22. The second oxide layer 23 serves to surround a gate electrode, which is formed later. According to an embodiment of the invention, the total thickness of the first and second oxide layers 22 and 23 is determined such that the portion of the first and second oxide layers 22 and 23 over the substrate 20 is 800-850 Å. The first and second oxide layers 22 and 23 may be formed of the same material.

A first mask pattern 24 is formed on the second oxide layer 23. The first mask pattern 24 is formed by coating the second oxide layer with a photosensitive layer and performing exposure and development so that the intervening area between the recesses of the recess pattern 21 is exposed.

Figure 3D:
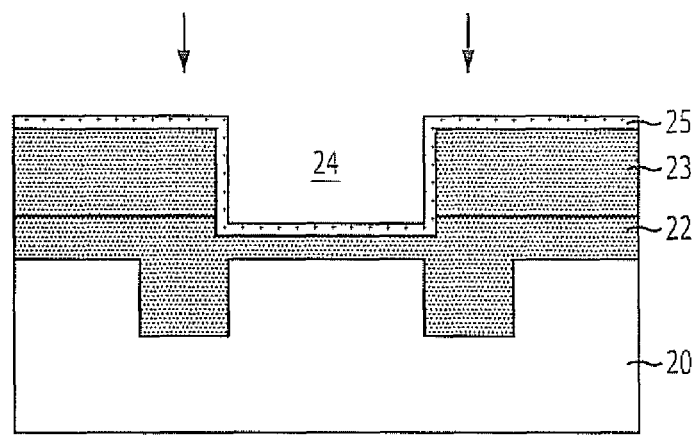

Referring to FIG. 3D, the second and first oxide layers 23 and 22 are selectively etched using the first mask pattern 24 (shown in FIG. 3C) as an etching barrier. According to an example, the thickness of the first oxide layer 22, which remains at the above discussed intervening area of the substrate 20 after the etching, is 20-50 Å. That is to say, the etched first oxide layer 22 has a thickness sufficient to serve as a gate dielectric layer between a gate pattern which is to be formed later and the substrate 20.

Consequently, the etched first and second oxide layers 22 and 23 provide a groove 24, in which a gate electrode is to be formed later.

The first and second oxide layers 22 and 23 are subjected to a nitration process so that the layers are changed into an oxynitride layer 25 up to a certain thickness. The nitration process for changing a part of the oxide layers 22 and 23 into the oxynitride layer 25 may be, for example, a method selected from the group consisting of a furnace-based process, a plasma nitration process, and a rapid thermal process.

Specifically, the plasma nitration process can be performed at a temperature of 100-700° C. using plasma gas including $N_2$ and Ar. The rapid thermal process can be performed at a temperature of 600-1,000° C. using $NH_3$ gas.

The oxynitride layer 25 serves to prevent the penetration phenomenon of dopant into the lower layer and the segregation phenomenon of the dopant towards the sidewall when a gate electrode is formed later using polysilicon. Therefore, in accordance with an embodiment of the present invention, a gate dielectric layer including a first oxide layer 22, a second oxide layer 23, and an oxynitride layer 25, which are stacked on one another, is formed.

This structure alleviates effects of the gate edge fringing field crowding phenomenon (which occurs when severe depletion of polysilicon near the gate edge leads to crowding of electric fields on the outermost field of the gate, and which raises concerns regarding current leakage, channel length decrease, etc.).

Figure 3E:
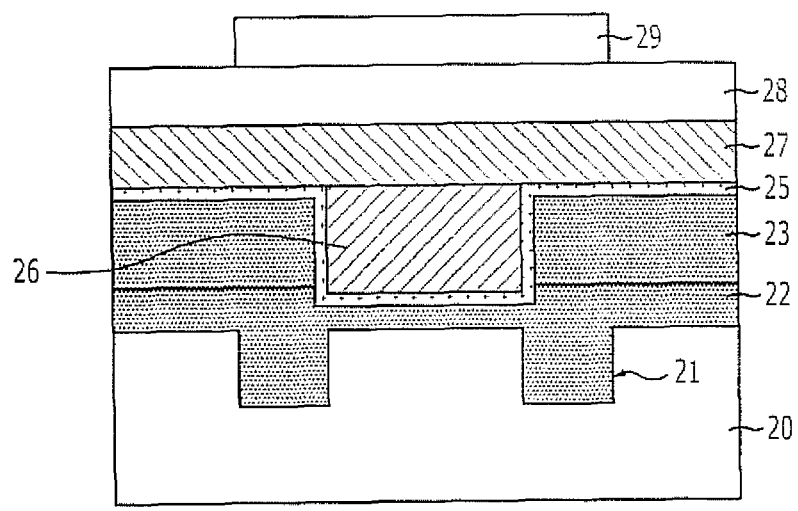

Referring to FIG. 3E, a polysilicon electrode 26 is formed on the oxynitride layer 25 so as to fill the groove 24. The polysilicon electrode 26 is formed by forming a polysilicon layer so as to fill the groove 24 and performing planarization so that the oxynitride layer 25 is exposed. Specifically, the planarization may be performed through a chemical mechanical polishing process.

An electrode metal layer 27 is formed on the polysilicon electrode 26 and the oxynitride layer 25. The electrode metal layer 27 is to be used as a gate metal electrode and, for example, may be formed of tungsten (W) having low specific resistance. Furthermore, barrier metal may be additionally formed to prevent diffusion of tungsten.

A hard mask layer 28 is formed on the electrode metal layer 27. The hard mask layer 28 serves to protect the gate electrode and to act as a hard mask during pattern for forming a gate pattern. Therefore, the hard mask layer 28 is formed of a material having a selectivity (for example, a selectivity as to different etching rates) with regard to the electrode metal layer 27 and the first and second oxide layers 22 and 23 and, specifically, may be formed as a nitride layer.

A second mask pattern 29 is formed on the hard mask layer 28. The second mask pattern 29 is formed by coating the hard mask layer 28 with a photosensitive layer and performing an exposure and development step so as to define an area in which a gate pattern is to be formed. Prior to forming the photosensitive layer, an anti-reflection layer for preventing reflection during exposure or a hard mask layer for securing etching margin may be additionally formed.

Figure 3F:
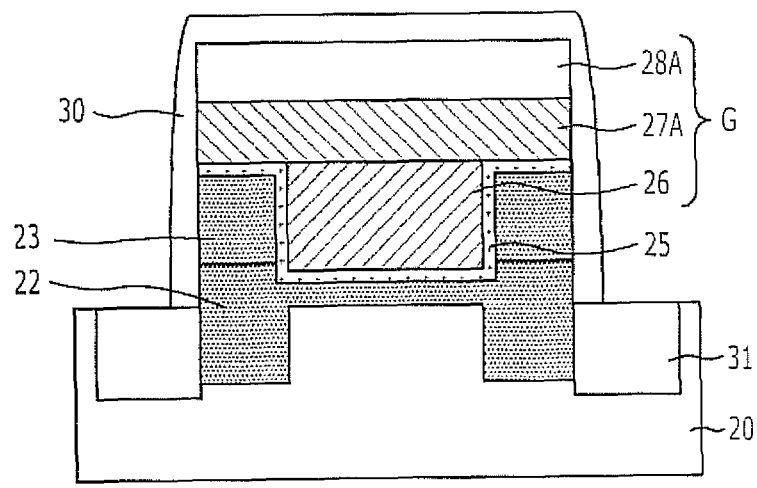

Referring to FIG. 3F, the hard mask layer 28 is etched using the second mask pattern 29 as an etching barrier to form a gate hard mask 28A. The electrode metal layer 27 is etched using the gate hard mask 28A as an etching barrier to form a metal electrode 27A. The oxynitride layer 25 and the second and first oxides 23 and 22 are etched to expose the substrate 20.

Consequently, a gate pattern G having a polysilicon electrode 26 surrounded by the gate dielectric layer is formed. That is, the gate dielectric layer surrounds the polysilicon electrode 26 in the length/width direction of the channel.

A gate spacer 30 is formed to cover both sidewalls of the gate pattern G. The gate spacer 30 serves to prevent abnormal oxidation, etc. of the metal electrode 27A in the following oxidation process and, specifically, may be formed of a nitride layer.

An ion implantation process is performed to form a source and drain regions 31. Specifically, the fact that the polysilicon electrode 26 is surrounded by the gate dielectric layer makes a selective oxidation process unnecessary.

As mentioned above, in accordance with an embodiment of the present invention, the gate dielectric layer, which includes oxide layers and a nitride/oxide layer stacked on one another, surrounds the polysilicon electrode 26 in the width/length direction of the channel, and the channel edge portion is surrounded by the gate dielectric layer. This structure improves the transistor performance with respect to the short channel effect such as Drain Induced Barrier Lowering (DIBL).

Furthermore, the fact that the polysilicon electrode 26 is surrounded by the gate dielectric layer, which includes an oxynitride layer 25 having a low dielectric constant through a nitration process, alleviates effects of the fringing electric field crowding phenomenon which may occur in the gate edge portion. Such alleviation also alleviates the poly depletion effect at the gate edge portion. This prevents degradation of the on-current of the device and degradation of transconductance of the device, which is caused by increase in the effective oxide layer thickness (Tox) due to poly depletion.

In addition, the main channel is surrounded by the gate dielectric layer, which can be used as an interdiffusion barrier during source and drain ion implantation. This improves characteristics with respect to the threshold voltage (Vt) variation of the device, alleviates effects of the electric field at the channel edge, and improves performance with respect to the narrow width/short channel effect.

Figure 4:
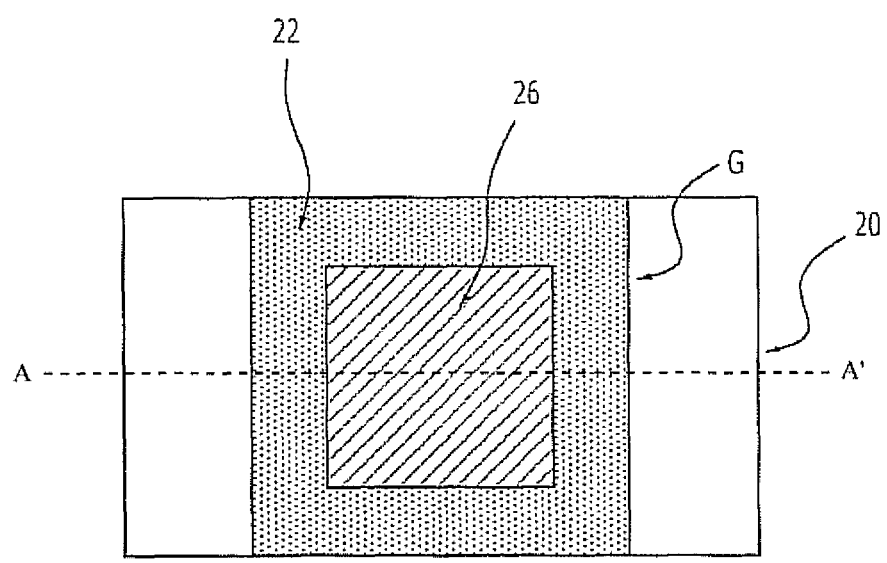
FIG. 4 is a top view illustrating the position of a gate dielectric layer and a polysilicon electrode in accordance with an embodiment of the present invention.

FIG. 4 is a top view illustrating the position of a gate dielectric layer and a polysilicon electrode in accordance with an embodiment of the present invention. The other layers are not shown for the purpose of clearly illustrating the spatial relationship between the gate dielectric layer and the polysilicon electrode 26.

It is clear from FIG. 4 that the gate dielectric layer 22 (reference numerals 23 and 25 are omitted for simplicity of description) is formed along the edge portion of the gate pattern G, which is formed on the substrate 20, and the polysilicon electrode 26 is surrounded by the gate dielectric layer 22 like an island. In addition, the recesses in FIG. 3A are formed in the same area as the gate dielectric layer 22, i.e. along the edge portion of the gate pattern G.

In accordance with exemplary embodiments of the present invention, the gate pattern has a polysilicon electrode surrounded by a gate dielectric layer, which includes oxide layers and a nitride/oxide layer stacked on one another. This structure improves performance with respect to the short channel effect.

Furthermore, the fringing electric field crowding phenomenon which may occur in the gate edge portion is alleviated, and degradation of transconductance is prevented.

In addition, the main channel is surrounded by the gate dielectric layer and it can be used as an interdiffusion barrier during source and drain ion implantation. This improves characteristics with respect to the threshold voltage (Vt) variation of the device, alleviates effect of the electric field at the channel edge, and improves performance with respect to the narrow width/short channel effect.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a recess pattern by selectively etching a substrate;
   forming a gate dielectric layer by filling the recess pattern on the substrate;
   forming a groove by selectively etching the gate dielectric layer, wherein a bottom surface of the groove is higher than the highest surface of the substrate;
   forming a polysilicon electrode filling the groove;
   forming an electrode metal layer on the polysilicon electrode and the gate dielectric layer; and
   forming a gate pattern by etching the electrode metal layer and the gate dielectric layer, wherein the recess pattern is formed along an edge portion of the gate pattern as a quadrilateral periphery, wherein the gate dielectric layer below the edge portion of the gate pattern has a lower protruding area completely filling the recess pattern both in the length direction and the width direction of a channel.

2. The method of claim 1, wherein the lower protruding area is formed as the quadrilateral periphery.

3. The method of claim 1, wherein the gate dielectric layer comprises an oxide layer and an oxynitride layer stacked on each other.

4. The method of claim 3, wherein the oxynitride layer is formed by nitrating the oxide layer to a certain thickness.

5. The method of claim 1, wherein the electrode metal layer is formed of tungsten.

6. The method of claim 1, further comprising forming a gate spacer of a nitride layer to cover both sidewalls of the gate pattern.

7. The method of claim 1, wherein the gate dielectric layer surrounds the polysilicon electrode both in the length direction and the width direction of the channel.

8. The method of claim 1, wherein an edge portion of the channel is surrounded by the gate dielectric layer.

9. A gate pattern of a semiconductor device, comprising:
a substrate having a recess pattern;
a gate dielectric layer formed on the substrate, filling the recess pattern and protruding over the substrate, and having a groove, wherein a bottom surface of the groove is higher than the highest surface of the substrate;
a polysilicon electrode filling the groove; and
a metal electrode formed on the polysilicon electrode and the gate dielectric layer,
wherein the gate dielectric layer below an edge portion of the gate pattern has a lower protruding area completely filling the recess pattern both in the length direction and the width direction of a channel.

10. The gate pattern of claim 9, wherein the recess pattern is formed along an edge portion of the gate pattern as a quadrilateral periphery.

11. The gate pattern of claim 9, wherein the lower protruding area is formed as a quadrilateral periphery.

12. The gate pattern of claim 9, wherein the gate dielectric layer comprises an oxide layer and an oxynitride layer stacked on each other.

13. The gate pattern of claim 9, further comprising:
a gate hard mask formed on the metal electrode; and
a gate spacer formed on sidewalls of the gate hard mask, the metal electrode, and the gate dielectric layer.

14. The gate pattern of claim 9, further comprising a gate spacer of a nitride layer formed on the gate pattern to cover both sidewalls of the gate pattern.

15. The gate pattern of claim 10, wherein the gate dielectric layer surrounds the polysilicon electrode both in the length direction and the width direction of the channel.

16. The gate pattern of claim 15, wherein an edge portion of the channel is surrounded by the gate dielectric layer.

* * * * *